United States Patent [19]

Nasu et al.

[11] Patent Number: 4,927,580
[45] Date of Patent: May 22, 1990

[54] METHOD FOR MANUFACTURING ELECTRONIC DEVICE INCLUDING A VIBRATION GENERATING ELEMENT

[75] Inventors: Kazuhiko Nasu; Kazuei Kenmochi; Tomohiko Niikawa; Atsushi Matsui, all of Osaka, Japan

[73] Assignee: Matsushita Electric Industrial Co., Ltd., Osaka, Japan

[21] Appl. No.: 284,427

[22] Filed: Dec. 14, 1988

[30] Foreign Application Priority Data

Dec. 15, 1987 [JP] Japan ................................. 62-316613

[51] Int. Cl.$^5$ ............................................. B29C 45/14
[52] U.S. Cl. .................................... 264/102; 264/242; 264/255; 264/261; 264/264; 264/272.13; 264/272.16; 264/272.17
[58] Field of Search ........... 264/102, 129, 263, 272.11, 264/272.19, 510, 242, 272.13, 254, 255, 264, 261, 272.16, 272.15, 272.17

[56] References Cited

U.S. PATENT DOCUMENTS 4,641,418  2/1987  Meddles .......................... 264/272.17

FOREIGN PATENT DOCUMENTS 49-42672  11/1974  Japan ..................................... 264/134
0033663   3/1979   Japan ................................. 264/272.17
0061934   4/1984   Japan ................................. 264/272.15
0111334   6/1984   Japan ................................. 262/272.17

Primary Examiner—James Lowe
Attorney, Agent, or Firm—Lowe, Price, LeBlanc, Becker & Shur

[57] ABSTRACT

A method for manufacturing an electronic device having therein a lead frame and a vibration-generating element integrally provided on the lead frame. The lead frame and the element are first provided in a metallic mold assembly comprising an upper mold portion and a lower mold portion, the upper and lower mold portions respectively having recess portions so as to form a cavity when the upper and lower mold portions are assembled with each other. A first sealing material is injected into the cavity so that the element is covered by the injected first sealing material, the first sealing material having a shrinkage property and a low adhesion property. After solidification of the injected first sealing material, they are removed from the mold assembly and then immersed in a second sealing material at a vacuum state so that the second sealing material is impregnated between the first sealing material portion and the lead frame. The second sealing material impregnated therebetween is hardened so as to seal a gap formed therebetween.

9 Claims, 4 Drawing Sheets

METHOD FOR MANUFACTURING ELECTRONIC DEVICE INCLUDING A VIBRATION GENERATING ELEMENT

BACKGROUND OF THE INVENTION

The present invention relates to a method for manufacturing an electronic device including at least one vibration generating element such as a VIF surface-wave filter and a RF surface-wave oscillating element usable for color-television picture apparatus and video tape recorders.

Generally known is a VIF surface-wave filter as shown in FIG. 1 which comprises a piezo-electric device 21, made of $LiNbO_3$ or $LiTaO_3$, which has on its surfaces a pair of input electrodes 22, a pair of output electrodes 23 and an earth electrode 24 which are formed in accordance with photolithography techniques and further, a surface-wave element 30 composed of an absorbing member 25 formed by applying a resin such as epoxy resin in accordance with the printing technique. The surface-wave element 30 is adhesively fixed onto a metallic stem 26 using an adhesive material such as epoxy resin and a lead terminal 27 of the stem 26 is coupled through wires 28 to the pair of input electrodes 22, the pair of output electrodes 23 and the earth electrode 24. A cap 29 is welded to the stem 26 to form a housing to cover the above-mentioned parts so as to form a space to thereby cause no impediment of vibration of the surface-wave element 30.

However, such a conventional technique results in an increase in manufacturing costs because the stem 26 is arranged such that the lead terminal 27 is fixed using a glass material. Furthermore, although in the above-mentioned conventional manufacturing technique the cap 29 and the stem 26 are generally arranged to be connected to each other by means of the resistance heat welding in order to protect the surface-wave element 30 from the outside air, the resistance heat welding causes completion adhesion therebetween due to the difficulty of even generation of heat at the circumference of the cap 29.

SUMMARY OF THE INVENTION

It is therefore an object of the present invention to provide an improved manufacturing method of an electronic device having a vibration-generating element.

In a method for manufacturing the electronic device according to the present invention, a lead frame and the element integrally provided on the lead frame are first inserted into a metallic mold assembly comprising an upper mold portion and a lower mold portion, the upper and lower mold portions respectively having recess portions so as to form a cavity when the upper and lower mold portions are assembled with each other and a first sealing material is injected into the cavity so that the element is covered by the injected first sealing material, the first sealing material having a shrinkage property and a low adhesion property. After solidification of the injected first sealing material, they are removed from the mold assembly and then immersed in a second sealing material at a vacuum state so that the second sealing material is impregnated between the first sealing material portion and the lead frame. The second sealing material impregnated therebetween is hardened so as to seal a gap formed therebetween.

According to the above-mentioned manufacturing method, a space between the first sealing material and the element required to preventing vibration of the element from being impeded is automatically and effectively formed by exfolication therebetween due to solidification of the first sealing material. A gap formed between the first sealing material and the lead frame is filled up by means of the second sealing material to keep the adhesion therebetween. This manufacturing method allows the electronic device to function as a chip because the space between the element and the first sealing material can be formed effectively.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Figure 1:
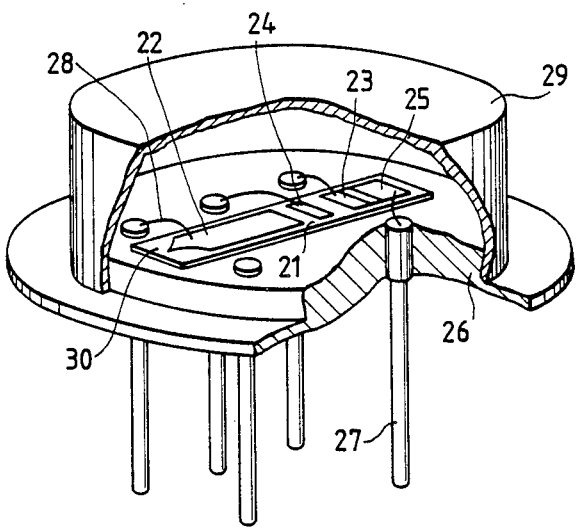
FIG. 1 is a partially broken perspective view of a conventional electronic device.
Figure 2A:
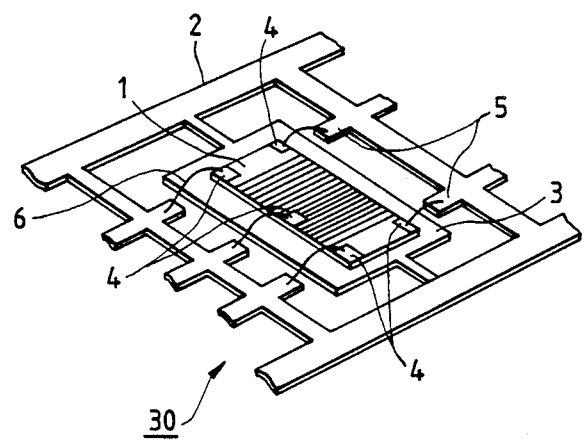
FIGS. 2A to 2H are illustrations for describing a manufacturing process of an electronic device according to an embodiment of the present invention.
Figure 2B:
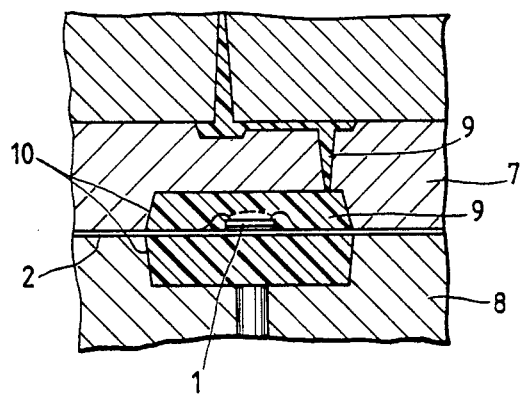
Figure 2C:
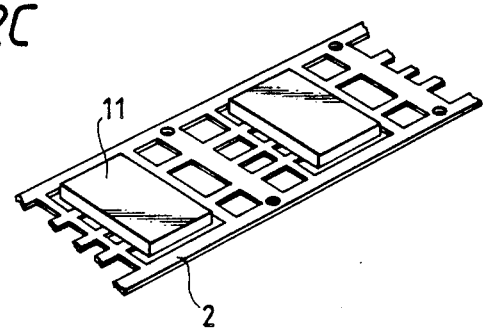
Figure 2D:
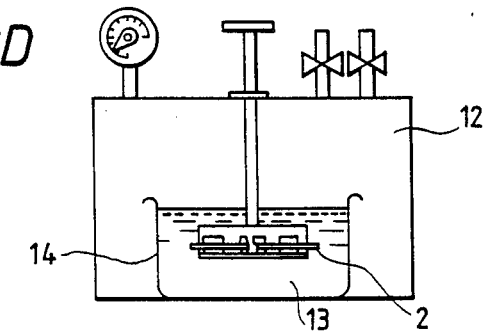
Figure 2E:
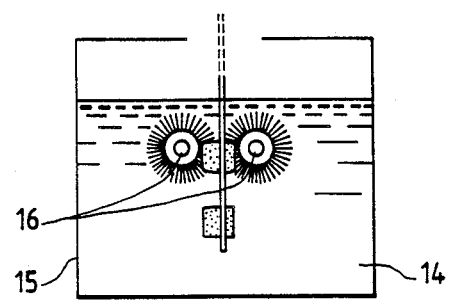
Figure 2F:
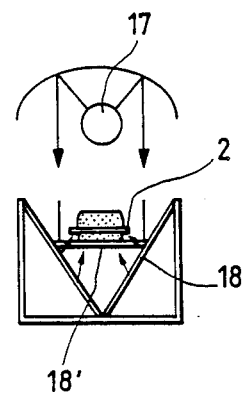
Figure 2G:
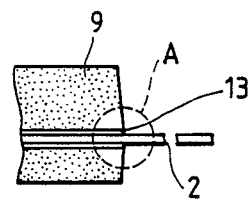

A first embodiment of the present invention will be described with reference to FIGS. 2A to 2H. In FIG. 2A, a surface-wave filter element 1 is provided at an island portion 3 of a lead frame 2 and electrodes 4 of the surface-wave filter element 1 are coupled through wires 6 to terminals 5 of the lead frame 2 so as to ensure conductivity therebetween. The assembly 30 composed of the surface-wave filter element 1 and the lead frame 2 is inserted into a metallic mold assembly comprising an upper mold portion 7 and a lower mold portion 8 as shown in FIG. 2B with the lead frame being interposed between the upper and lower mold portions 7, 8 and the filter element 1 being encased in a cavity 10 formed therebetween. After the insertion of the mold assembly thereinto, a sealing resin 9 such as a polyphenylene sulfide (PPS) and aromatic polyester (i.e., liquid crystal polymer) having a formation-shrinkage property and a low adhesive property is injected into the cavity 10 of the mold assembly for sealing of the filter element 1, thereby resulting in a molding portion 11 formed on the lead frame 2 as shown in FIG. 2C. Thereafter, the assembly 30 is kept in a vacuum vessel 12 as shown in FIG. 2D for about one minute and then placed in a receptacle 14 which is disposed in the vacuum vessel 12. The receptacle 14 is filled with a liquid-like sealing resin 13 such as an anaerobic and ultraviolet-curing type adhesive material (for example, polyester type acrylic acid diester compound, (meta) acrylic acid ester compound, epoxy acrylate type compound), so that the assembly 30 is immersed therein and the liquid-like sealing resin 13 is impregnated into and between the first-mentioned sealing resin 9 and the lead frame 2. Thereafter, the vacuum vessel 12 is released from the vacuum state so that the pressure therein becomes equal to the atmospheric pressure with the assembly 30 being left in the receptacle 14 as it is. After leaving it for about one minute, the assembly 30 is taken out from the receptacle 14 and the vacuum vessel 12 and then inserted into a cleaning vessel 15 filled with an organic solvent 14 as shown in FIG. 2E. The molding 11 of the assembly 30 is cleaned in the cleaning vessel 15 by means of an appropriate cleaning device such as cleaning brushing device 16 driven by an electric motor so as to remove an excessive resin portion.

Figure 2H:
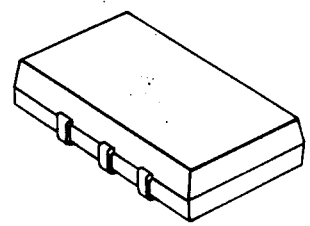

After the cleaning, the assembly 30 is placed on a bed plate 18' which allows transmission of light. The bed plate 18' is disposed horizontally to be sandwiched between two ultraviolet-reflecting mirrors 18 which are arranged so that the surfaces thereof intersect each other at a predetermined angle. The molding portion 11 of the assembly 30 placed thereon is exposed to ultraviolet light from an ultraviolet lamp 17 disposed in opposed relation to the bed plate 18' with the assembly 30 being interposed therebetween, whereby the ultraviolet light therefrom reaches the molding portion 11 directly or after reflections on the two ultraviolet mirrors 18, i.e., from upper and lower sides. As a result of the illumination of the ultraviolet light to the molding portion 11, the liquid-like sealing resin 13 impregnated into and between the molding portion 11, i.e., the seaing resin 9, and the lead frame 2, is hardened at end portions indicated by character A in FIG. 2G. After hardening, unnecessary portions of the terminals 5 of the lead frame 2 are removed, and the remaining portions thereof are bent along the configuration of the molding portion 11 as illustrated in FIG. 2H, thereby obtaining a completed surface-wave filter device.

Figure 3:
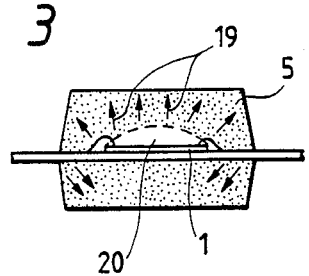
FIG. 3 is an illustration for describing shrinkage stresses applied to a sealing resin for covering an electronic element.

FIG. 3 is an illustration for describing formation of a space made as a result from using the sealing resin (PPS) 9. That is, since the sealing resin 9 has a low adhesion as described above, in the steps of cooling, shrinkage and solidification, forces 19 are generated toward the outside with respect to the filter element 1 so that the inside portion of the sealing resin 9 contacting with the filter element 1 is separated therefrom by exfoliation so as to form a space 20 (about several micrometers in height) between the filter element 1 and the sealing resin 9. This space 20 prevents the vibration of the filter element 1 from being impeded.

The low adhesion of the sealing resin 9 with respect to the metallic lead frame 2 causes deterioration of the sealing performance therebetween. However, this problem is resolved and covered by using the liquid-like sealing resin 13. The liquid-like sealing resin 13 to be used should be one having a high heat-resisting property and an excellent anaerobic effect. Here, it is preferable that the impregnation condition of the liquid-like sealing resin 13 be appropriately determined in accordance with the thickness of the sealing resin 9 and so on.

A description will now be made of a second embodiment of the present invention. The second embodiment is similar to the first embodiment with the exception of the sealing resin 9 injection step into the mold assembly and therefore the description of the corresponding steps will be omitted for brevity. The difference between the first and second embodiments is that the upper and lower mold portions 7 and 8 are set to different temperatures on injection of the sealing resin 9. That is, in the sealing resin 9 injection step as illustrated in FIG. 2B, the temperature of the lower mold portion 8 is set to be higher than that of the upper mold portion 7. For example, the lower mold portion 8 is heated up to 170° C. and the upper mold portion 7 is heated up to 150° C. That is, the temperature of the upper mold portion 7 facing the filter element 1 is set to be lower as compared with that of the lower mold portion 8. This results in difference between cooling velocities thereof to thereby cause a difference in the shrinkage stresses at the different portions, whereby a larger exfoliation occurs between the molding portion 11 and the lead frame 2 to make greater the space 20.

Figure 4A:
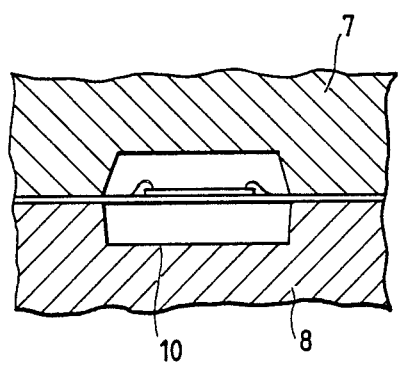
FIGS. 4A, 4B and 5 are cross-sectional views of a mold assembly used for manufacturing the electronic device.
Figure 4B:
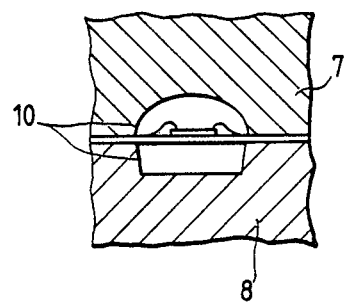
Figure 5:
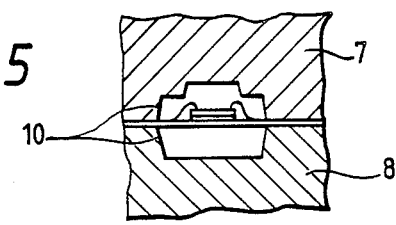

A third embodiment of this invention will be described hereinbelow with reference to FIGS. 4A and 4B which are respectively a front cross-sectional view of a mold assembly used in the third embodiment and a side cross-sectional view thereof. A feature of this embodiment is a configuration of the cavity 10 of the upper mold portion 7 for injection of the sealing resin 9. That is, as shown in the cross-sectional view of FIG. 4B, the wall of the cavity 10 of the upper mold portion 7 side is made round, that is, the corners of the wall thereof are rounded off. Here, it is also appropriate to form the wall stepwise to have a concaved portion along the axis of the upper mold portion 7 as shown in FIG. 5 which is a cross-sectional view of the mold assembly. These arrangements cause improvement in peeling-off of the sealing resin 9 from the filter element 1 to form a larger space 20. The larger space formation allows more stability of the initial characteristic of the surface-wave filter device.

It should be understood that the foregoing relates to only preferred embodiments of the present invention, and that it is intended to cover all changes and modifications of the embodiments of the invention herein used for the purposes of the disclosure, which do not constitute departures from the spirit and scope of this invention.

If this invention is employed for electronic devices used under general environmental conditions, the second sealing process may be omitted achieve a decrease in manufacturing costs. Furthermore, it is also appropriate that as the second sealing, the transfer formation of epoxy resin generally used for the IC sealing is employed, similarly resulting in satisfactory effects.

What is claimed is:

1. A method for manufacturing an electronic device having therein a lead frame and a vibration-generating element integrally provided on said lead frame, comprising the steps of;

(a) inserting said lead frame and said element into a metallic mold assembly comprising an upper mold portion and a lower mold portion, said upper and lower mold portions respectively having recess portions so as to form a cavity when said upper and lower mold portions are assembled with each other;

(b) injecting into said cavity a first sealing material having a shrinkage property and a low adhesion property so that said element is covered by the injected first sealing material, the shrinkage property and low adhesion property of said first material causing formation of a space on said element in response to solidification so as to prevent the vibration of said element from being impeded;

(c) after the solidification of the injected first sealing material, removing said lead frame and said sealing-material-covered element from said mold assembly immersing it in a second sealing material at a vacuum state so that said second sealing material is impregnated between said first sealing material portion and said lead frame to seal the space therebetween; and (d) after release from the immersion state, curing said second sealing material impregnated therebetween.

2. A method as claimed in claim 1, wherein the step (b) comprises a step of heating said mold assembly on the injection of said first sealing material thereinto so that the temperature of said upper mold portion is lower than that of said lower mold portion.

3. A method as claimed in claim 1, wherein the step (a) comprises a step of making a wall of said recess portion of said upper mold portion round.

4. A method as claimed in claim 1, wherein the step (b) comprises a step of concaving a center portion of a wall of said recess portion of said upper mold portion along an axis of said upper mold portion.

5. A method for manufacturing an electronic device having therein a lead frame and a vibration-generating element integrally provided on said lead frame, comprising the steps of;

(a) inserting said lead frame and said element into a metallic mold assembly comprising an upper mold portion and a lower mold portion, said upper and lower mold portions respectively having recess portions so as to form a cavity when said upper and lower mold portions are assembled with each other; and (b) injecting into said cavity a sealing material having a shrinkage property and a low adhesion property so that said element is covered by the injected sealing material, the shrinkage property and low adhesion property of said sealing material causing formation of a space between said sealing material and said element in response to solidification thereof and said space therebetween preventing the vibration of said element from being impeded.

6. A method according to claim 5, wherein said sealing material is a sealing resin selected from the group consisting of polyphenylene sulfide and aromatic polyesters.

7. A method according to claim 5, wherein step (b) includes a step of heating said mold assembly on the injection of said sealing material thereinto so that the temperature of said upper mold portion is lower than that of said lower mold portion.

8. A method according to claim 5, wherein step (a) comprises a step of making a wall of said recess portion of said upper mold portion round.

9. A method according to claim 5, wherein step (b) comprises a step of concaving a center portion of a wall of said recess portion of said upper mold portion along an axis of said upper mold portion.

* * * * *